United States Patent
Okubo et al.

[11] Patent Number: 6,013,169
[45] Date of Patent: Jan. 11, 2000

[54] METHOD OF REFORMING A TIP PORTION OF A PROBE

[75] Inventors: Masao Okubo; Kazumasa Okubo; Hiroshi Iwata, all of Amagasaki, Japan

[73] Assignee: Japan Electronic Materials Corp., Amagasaki, Japan

[21] Appl. No.: 09/038,929

[22] Filed: Mar. 9, 1998

[30] Foreign Application Priority Data

Jul. 24, 1997 [JP] Japan ................................. 9-198331

[51] Int. Cl.[7] ....................................... C25D 5/50
[52] U.S. Cl. ........................... 205/224; 205/149; 205/228
[58] Field of Search ................................ 205/149, 224, 205/228; 428/532; 148/DIG. 30, DIG. 37

[56] References Cited

U.S. PATENT DOCUMENTS

| | | | |
|---|---|---|---|
| 2,772,227 | 11/1956 | Quaely et al. | 204/32 |
| 4,088,803 | 5/1978 | Kubo et al. | 427/123 |
| 4,101,386 | 7/1978 | Dotzer et al. | 204/32 R |
| 4,518,914 | 5/1985 | Okubo et al. | |
| 4,523,144 | 6/1985 | Okubo et al. | |
| 4,567,433 | 1/1986 | Ohkubo et al. | |
| 4,840,711 | 6/1989 | Joseph | 204/15 |
| 5,055,778 | 10/1991 | Okubo et al. | |
| 5,134,365 | 7/1992 | Okubo et al. | |

Primary Examiner—Kathryn Gorgos
Assistant Examiner—Erica Smith-Hicks
Attorney, Agent, or Firm—Oblon, Spivak, McClelland, Maier & Neustadt, P.C.

[57] ABSTRACT

A method of reforming a tungsten probe tip includes forming a non-oxidizing metallic film on the surface of the tungsten probe tip, heating the film in a non-oxidizing atmosphere or vacuum, and diffusing the film into the tungsten probe tip. The non-oxidizing metallic film can be formed from a metal such as gold, platinum, rhodium, palladium, and iridium. The reformed tungsten probe tip can be used in low voltage and low current testing, and has excellent abrasion resistance, conductivity and oxidation resistance.

9 Claims, 2 Drawing Sheets

METHOD OF REFORMING A TIP PORTION OF A PROBE

DETAILED DESCRIPTION OF THE INVENTION

1. Industry Field of the Invention

The present invention relates to techniques for reforming tip portions of probes used at relatively low voltage and current, such as probes used in wafer testing in an integrated circuit.

2. Description of the Related Arts

In the past, for the probe in the wafer test in an integrated circuit, metals which are hard and have a high elasticity, for example, such as tungsten and beryllium copper alloy, are used. Particularly, wires which are excellent in abrasion resistance and have a small diameter, say scores of several ten μm, can be available relatively inexpensively. Therefore, tungsten is often used for the probe. At present, a tungsten probe is used for more than 90% of probe cards.

While tungsten has an excellent performance as a material for a probe, there is a disadvantage in that the surface thereof tends to be oxidized so that a tip portion of a probe lowers in conductivity. Normally, an layer is vapor-deposited on electrodes in the integrated circuit. When such a portion is repeatedly subjected to contact thousands times and tens of thousands times, and a current flows, a temperature of a tip portion of a probe rises and the tip portion is oxidized due to the heat generation phenomenon caused by frictional heat and contact resistance, and further, such a portion reacts with aluminum vapor-deposited on the electrode in the integrated circuit whereby an aluminum oxide is generated and adhered to the tip portion of a probe.

When such a phenomena as described occurs, the electric resistance of the surface of the tip portion of a probe increases to impede the wafer test. It is therefore necessary to polish and refresh the tip portion of a probe. Ordinarily, the polishing operation for the tip portion of a probe is carried out once every thousand times the probe contacts the wafer. This polishing operation poses a problem in the wafer test operation which is carried out fully automatically.

For improving the oxidation resistance, there is contemplated a method for joining gold, platinum or palladium to the tip portion of a probe. However, such metals are not practical because their abrasion resistance is poor as compared with tungsten. Further, tungsten is a hard material, and it is difficult to form a film having a rigid adhesion on the surface thereof.

SUMMARY OF THE INVENTION

The present invention has been achieved in order to solve the problem as noted above. An object of the present invention is to provide a method of reforming a tip portion a probe, comprising: forming a non-oxidizing metallic film on a tip portion of a tungsten probe, heating it and diffusing the metallic film into tungsten thereby reforming the tip portion into a tungsten probe having excellent abrasion resistance, conductivity and oxidation resistance.

The gist of the present method comprises: forming a non-oxidizing metallic film on the surface of a tungsten probe by a metallizing method, thereafter heating it in a non-oxidizing atmosphere or in vacuum, and diffusing said non-oxidizing metallic film into tungsten.

The most general method for metallizing a nonoxidizing metal on the surface of a tungsten probe in the present invention employs an electric plating other methods that may be employed include an electroless plating, a vacuum vapor deposition, and an ion cluster.

The diffusion of the non-oxidizing metallic film into tungsten is carried out in the non-oxidizing atmosphere held at a high temperature. For example, a hydrogen furnace which can reach hundreds of degrees of temperature in a hydrogen stream is preferable. Other than the hydrogen furnace, there is a method for heating in an inert gas atmosphere or in vacuum.

When the non-oxidizing metal is diffused into tungsten as described above, the oxidation resistance and the conductivity of the surface of the tungsten probe can be improved while maintaining the abrasion resistance and toughness of tungsten itself. Of course, the content of metal diffused reduces as it moves into inside from the metallized surface. However, the presence of the non-oxidizing metal over the range of scores of μm from the surface of the tungsten probe considerably improves the oxidation resistance and conductivity while maintaining the abrasion resistance of the tip portion of a tungsten probe. The non-oxidizing metals herein terms are gold, platinum, rhodium, palladium, iridium, etc., and these metals are elements which are thermally diffused into tungsten.

As will be apparent from the foregoing, according to the present invention, it is possible to obtain a tungsten probe without impairing the toughness, abrasion resistance and elasticity of tungsten and excellent in oxidation resistance and conductivity by diffusing a non-oxidizing metal on a tip portion of a tungsten probe to reform it.

DESCRIPTION OF THE PREFERRED EMBODIMENTS

Figure 1:
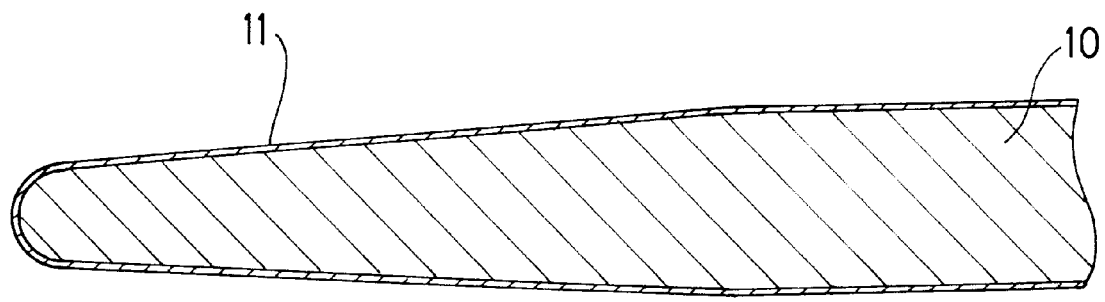
FIG. 1 is a view showing a section of the state in which a non-oxidizing metallic film is formed on the surface of a tip portion of a tungsten probe by a metallizing method.

The embodiments according to the present invention will be explained hereinafter with reference to FIGS. 1 and 2. FIG. 1 is a sectional view showing a state in which a non-oxidizing metallic film is formed on the surface of a tip portion of a tungsten probe by a metallizing method. In the figures, reference numeral 10 designates a tungsten portion, and reference numeral 11 externally thereof designates a non-oxidizing metallic film. The thickness of the metallic film is normally approximately several μm, which is overwhelmingly thin as compared with a diameter 80 to 300 μm of a probe. Even if the metallic film should be excellent in oxidation resistance, these layers inferior in abrasion resistance become easily worn as a result of contact with an electrode in an integrated circuit of a probe at the time of test.

Next, the tungsten probe formed with the non-oxidizing metallic film shown in FIG. 1 is heated in the non-oxidizing atmosphere. The heating conditions are determined according to the time and temperature necessary to diffuse a non-oxidizing metallic element into tungsten to a predetermined thickness. However, when heated at a high temperature, the element is diffused in a short period of time, whereas a recrystallization of tungsten occurs, as a result of which the toughness, abrasion resistance, elasticity and the like which are most important as the performance of a probe possibly lower. Accordingly, it is important to carry out the diffusion at a temperature as low as possible and at a retaining time at the minimum as necessary, and after diffusion, to carry out a rapid cooling in the non-oxidizing atmosphere to suppress the increase in size of tungsten crystalline grains. In order to effect diffusion of about 20 μm using gold which is a non-oxidizing metal, the retention for about ten minutes at 500° C. is necessary.

Figure 2:
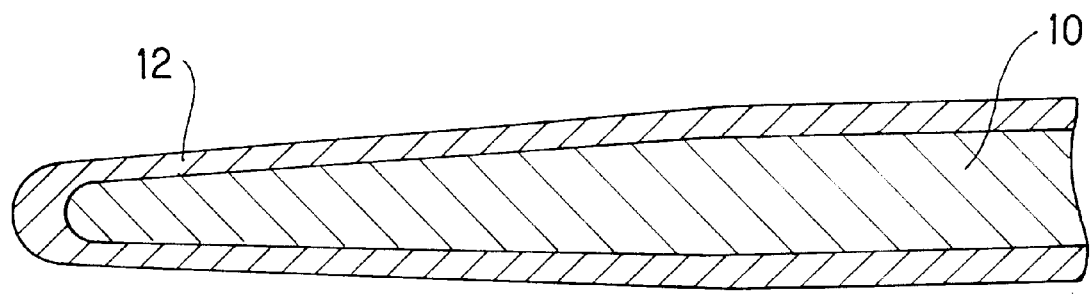
FIG. 2 is a view showing a section of a tip portion of a tungsten probe of the state in which a non-oxidizing metal is diffused into tungsten.

FIG. 2 is a sectional view of a tip portion of a tungsten probe in the state in which the non-oxidizing metal is diffused into tungsten. In the figure, reference numeral 12 designates a diffusion layer of the non-oxidizing metal. The content of the non-oxidizing metal in the diffusion layer reduces as it moves into inside from the surface of the tungsten probe, but the effect of the oxidation resistance and conductivity exhibited by the non-oxidizing metal is observed to a considerable depth.

Embodiment 1

A tungsten wire having 250 μm of diameter is cut to a length of 41 mm. One end is subjected to electrolytic polishing in an AC field of 40 V in a 3% solution of caustic potash to sharpen a tip portion to prepare a probe. After it has been well washed and dried, the tungsten probe is used as a cathode and a gold electrode is used as an anode. A tip portion of a probe is subjected to metal plating using a DC stabilized power source using a metal plating liquid Autoronex C manufactured by Electro-plating Engineers Japan Co. Ltd. When plating is done under the conditions that a temperature of a plating bath is 42° C. and a current density if 0.3 A/dm$^2$ for 60 minutes, the tip portion of a probe is coated with a gold film having a thickness of about 2 μm.

Then, after well washed and dried, and held for 20 minutes at 500° C. in a hydrogen stream, a gold film was diffused into tungsten. After diffusion, a section of the tip portion of a probe was observed by a scanning electronic microscope (SEM). In the probe not subjected to diffusion, naturally, about 2 μm of a surface layer is gold, and the interior is 100% tungsten. However, in the probe subjected to diffusion, measured values were obtained such that in the uppermost surface layer, gold is 99.6 mass %, and in the 20 μm interior, gold is 11.2 mass %. This fact indicates that by the diffusion, gold is diffused in tungsten.

For confirmation of the reformed effect of the present invention, two kinds of tungsten probes, one in which gold is diffused after gold plating, and the other as gold plating is, were prepared. These were lightly polished with an emery paper of 2000 meshes to remove a surface layer of 2 μm, after which a tip portion of a probe as heated by a torch burner and forcibly oxidized. In this condition, the contact resistance of the tip portion of a probe was measured. As a result, the one as gold plating is (one in which gold is not diffused) had 8 ohm of contact resistance value whereas that of one in which gold is diffused was 1 ohm or less. An obvious difference therebetween was observed. It is apparent from the foregoing that the method of reforming a tip portion of a probe according to the present invention imparts the tip portion of a probe the performance of oxidation resistance.

Embodiment 2

A tungsten wire having 80 μm of diameter and 60 mm of length was used, and a tip portion of one end thereof was sharpened to provide a probe in the same method as that of Embodiment 1 described above. Thereafter, an electrolytic polishing liquid was well washed and dried, after which it was mounted on a vacuum vapor deposition apparatus, and 3 μm of palladium was vapor deposited to form a film on the surface of the probe. This probe was put into a nickel boat and held for 20 minutes at 600° C. in an argon stream, and a palladium film was diffused into tungsten.

A vertically operative type probe card was prepared using the aforesaid probe. For the purpose of comparison, the half number of probes used were palladium vapor deposited. With this probe card, 2000 times repetitive contacts were conducted while applying 100 μm overdrive to a silicone wafer having the entire surface aluminum vapor deposited. This simulated the test of an integrated circuit.

The contact resistance values of the tip portion of a probe were measured before and after the contact. A group as the palladium vapor deposition is (one in which palladium is not diffused) was changed from less than 1 ohm to 2 ohm, whereas a group in which palladium is diffused has no difference before and after contact, and any of them were less than 1 ohm. As described above, the method of reforming a tip portion of a probe according to the present invention can impart the tip portion of a tungsten probe the excellent performance of oxidation resistance and conductivity.

Embodiment 3

A tungsten wire having 150 μm of diameter and 60 mm of length was used, and a tip portion of one end thereof was sharpened to provide a probe in the same method as that of Embodiment 1 described above. Thereafter, an electrolytic agent was well washed and dried, after which it was plated with non-electrolytic palladium plating chemical agent. The agent is made by Ishihara Chemical Industries Co. Ltd. (Address: 5-26 Nishi-yanagihara-machi, Hyogo-ku, Kobe, Japan) and the commercial name is "APP process". When plating is done under the condition that a temperature of a plating bath is 50° C. for 10 minutes. The plating thickness is about 0.2 μm.

Next, the probe is plated with non-electrolytic gold plating chemical agent. The agent is made by Okuno Chemical Industries Co. Ltd. (Address: 4-7-10 Dosho-machi, Chuo-ku, Osaka, Japan) and the commercial name is "OPC Muden gold 25". When plating is done under the condition that temperature of a plating bath is 65° C. for 90 minutes. Because of thin palladium film accelerating to deposit smooth gold film, the probe is coated with a gold film having a thickness of about 2 μm.

Figure 3:
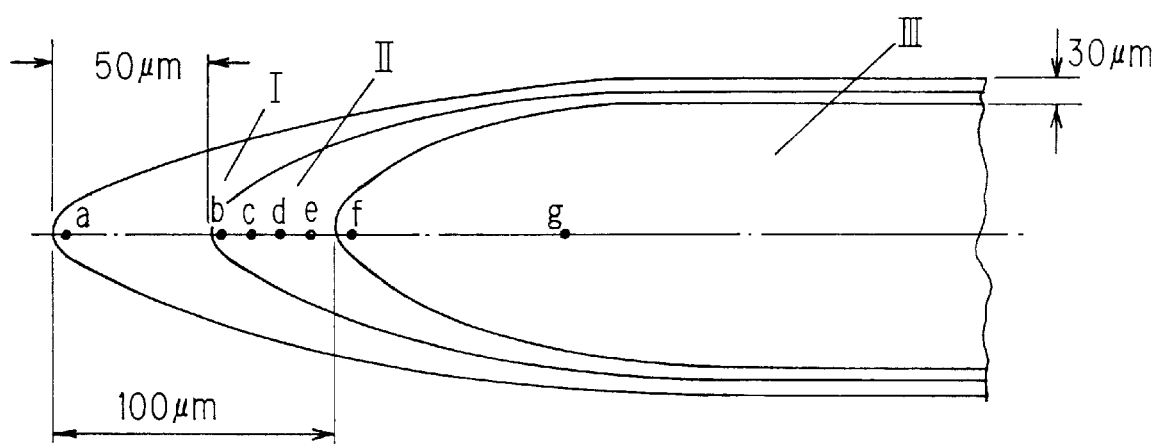
FIG. 3 is a view showing the state of diffusion of gold into tungsten in which a palladium plating having approximately 0.2 μm of plating thickness is applied to the surface of a tungsten prove, a gold plating having approximately 2 μm of plating thickness is applied thereto, and after this, a diffusion treatment is applied for 10 minutes at 650° C.

Then, after well washed and dried, and held for 60 minutes at 650° C. in hydrogen atmosphere, and a gold film was diffused into tungsten. After diffusion, section of the tip portion of a probe was observed by optical microscope and analysed by a scanning electronic microscope (SEM). The result is shown in FIG. 3. There are golden colored portion I, II and no golden colored portion III of the section in optical microscopic observation. The thickness of the colored layers are about 30 μm from edge of tungsten. In the case of tip portion, the thickness are achieved to 100 μm. The portion I has deep golden color and II has light golden color in optical observation. The portion III has not golden color.

The gold contents are shown in the following. (Symbols are illustrated in FIG. 3.)

a: (5 μm from tip) 99.1%
b: (55 μm from tip) 99.8%
c: (70 μm from tip) 2.6%
d: (80 μm from tip) 1.0%
e: (95 μm from tip) 0.8% f: (105 μm from tip) 0.7%
g: (200 μm from tip) 0.4%

What is claimed is:

1. A method of reforming a tungsten probe tip, the method comprising:

forming a non-oxidizing metallic film on a surface of a tungsten probe tip, heating the non-oxidizing metallic film in a non-oxidizing atmosphere, and diffusing the non-oxidizing metallic film into the tungsten probe tip, wherein the non-oxidizing metallic film comprises a metal selected from the group consisting of gold, platinum, rhodium, palladium and iridium.

2. The method according to claim 1, wherein the non-oxidizing metallic film is formed on the surface of the tungsten probe tip by electroplating.

3. The method according to claim 1, further comprising polishing the tungsten probe tip prior to forming the non-oxidizing metallic film on the surface of the tungsten probe tip.

4. The method according to claim 1, wherein the non-oxidizing metallic film formed on the surface of the tungsten probe tip has a thickness between about 0.2 μm and about 2 μm before the non-oxidizing metallic film is diffused into the tungsten probe tip.

5. The method according to claim 1, further comprising, before the diffusing the non-oxidizing metallic film into the tungsten probe tip, forming a non-oxidizing metallic layer on the non-oxidizing metallic film, wherein the non-oxidizing metallic layer comprises a metal selected from the group consisting of gold, platinum, rhodium, palladium and iridium.

6. The method according to claim 1, wherein the non-oxidizing atmosphere is a vacuum.

7. The method according to claim 1, wherein the non-oxidizing atmosphere comprises hydrogen.

8. The method according to claim 1, wherein the non-oxidizing atmosphere comprises an inert gas.

9. The method according to claim 1, wherein the non-oxidizing metallic film is heated to a temperature in a range from 500° C. to 650° C. and diffused into the tungsten probe tip for a period of time in a range from 10 minutes to 60 minutes.

* * * * *